(12) United States Patent  (10) Patent No.: US 7,045,831 B2
Narazaki  (45) Date of Patent: May 16, 2006

(54) SEMICONDUCTOR DEVICE

(75) Inventor: Atsushi Narazaki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/918,355

(22) Filed: Aug. 16, 2004

(65) Prior Publication Data

US 2005/0151254 A1    Jul. 14, 2005

(30) Foreign Application Priority Data

Jan. 14, 2004    (JP) .............................. 2004-006513

(51) Int. Cl.
*H01L 29/73* (2006.01)
*H01L 29/74* (2006.01)
*H01L 31/111* (2006.01)
*H01L 27/082* (2006.01)
*H01L 27/102* (2006.01)

(52) U.S. Cl. ................... 257/177; 257/178; 257/584; 257/751; 257/753; 257/763; 257/765; 257/766; 257/770; 257/771; 257/779

(58) Field of Classification Search ................ None
See application file for complete search history.

(56) References Cited

U.S. PATENT DOCUMENTS 4,560,421 A * 12/1985 Maeda et al. ............... 438/154

5,027,180 A * 6/1991 Nishizawa et al. ......... 257/266

FOREIGN PATENT DOCUMENTS

| JP | 2002-198515   |   | 7/2002 |
|----|---------------|---|--------|
| JP | 2003152175 A  | * | 5/2003 |
| JP | 2003-243585   |   | 8/2003 |
| JP | 2003273346 A  | * | 9/2003 |

* cited by examiner

*Primary Examiner*—David E. Graybill
(74) *Attorney, Agent, or Firm*—McDermott Will & Emery LLP (57) ABSTRACT

A semiconductor device of the present invention comprises a semiconductor chip, metal layers formed on a first main surface of the semiconductor chip, a first conductive layer layered on a second main surface of the semiconductor chip, consisting of a plurality of conductive films, a second conductive layer layered on the metal layer, having a layered structure consisting of a plurality of conductive films formed in the same order as in the first conductive layer as viewed from the semiconductor chip and a third conductive layer layered on the metal layer, having a layered structure consisting of a plurality of conductive films formed in the same order as in the first conductive layer as viewed from the semiconductor chip. The plurality of conductive films comprise a nickel film and a low contact resistance conductive film having contact resistance with the semiconductor chip which is lower than that of the nickel film. The low contact resistance conductive film and the nickel film are formed in this order from the semiconductor chip. With such a structure, a semiconductor device ensuring simplification of its manufacturing process can be provided.

16 Claims, 7 Drawing Sheets

SEMICONDUCTOR DEVICE

BACKGROUND OF THE INVENTION

1. Field of the Invention

The present invention relates to a semiconductor device, and more particularly to a semiconductor device using a manner of direct lead bonding.

2. Description of the Background Art

In background-art power semiconductor devices, when a source electrode plate and a drain electrode plate are soldered to a power semiconductor chip, a nickel film is formed between the power semiconductor chip and each of the electrode plates in order to ensure bonding thereof using the solder.

The source electrode plate is provided on the side of a first main surface of the power semiconductor chip. The drain electrode plate is provided on the side of a second main surface of the power semiconductor chip. As the power semiconductor chip, a MOSFET (Metal Oxide Semiconductor Field Effect Transistor), an IGBT (Insulated Gate Bipolar Transistor), or the like may be used.

Such a method as discussed above where the source electrode plate and the drain electrode plate are bonded directly to a predetermined conductive film (nickel film) formed on the power semiconductor chip with no wire therebetween is termed "direct lead bonding". In recent, the direct lead bonding is adopted more than before to ensure lower resistance of the device.

Further, on the first main surface side of the power semiconductor chip, a predetermined pattern is usually formed. In order to protect the pattern from external forces, a metal layer such as aluminum-silicon or the like is formed between the first main surface of the power semiconductor chip and the nickel film.

On the second main surface side of the power semiconductor chip, formation of the nickel film directly on the second main surface causes a problem that the contact resistance between the power semiconductor chip and the nickel film should be increased.

Then, on the second main surface side, a conductive film having lower contact resistance with the power semiconductor chip (hereinafter, referred to as "low contact resistance conductive film") is formed between the power semiconductor chip and the nickel film.

When a heat treatment is performed on the power semiconductor device, transverse stresses are exerted on the nickel film and the low contact resistance conductive film. The transverse stresses are caused in accordance with thermal expansion coefficients of the nickel film and the low contact resistance conductive film.

When the low contact resistance conductive film is formed only on the second main surfaced side of the power semiconductor chip as discussed above, however, there arises a difference between a transverse stress caused on the first main surface side due to presence of the nickel film and a transverse stress caused on the second main surface side due to presence of the nickel film and the low contact resistance conductive film. Due to the difference of these transverse stresses, the power semiconductor chip is disadvantageously warped so that its first main surface side should become convex.

In order to relieve this warp of the power semiconductor chip, the low contact resistance conductive film additionally provided on the second main surface side has been formed also between the nickel film and the metal layer on the power semiconductor chip on the first main surface side. In other words, the layered structure consisting of the conductive films formed on the second main surface of the power semiconductor chip is the same as that consisting of the conductive films formed on the first main surface side as viewed from the power semiconductor chip.

Further, one end of an aluminum wire is bonded onto the first main surface side of the power semiconductor chip, besides the source electrode plate. The other end of the aluminum wire is connected to a gate electrode.

Prior arts relating to the structure of the above power semiconductor device are shown in, e.g., FIG. 2 of Japanese Patent Application Laid Open Gazette No. 2002-198515 (Patent Document 1) and FIG. 1 of Japanese Patent Application Laid Open Gazette No. 2003-243585 (Patent Document 2).

The prior-art technique on the power semiconductor device causes complication in manufacture process since a process of bonding the source electrode plate with solder and a wire-bonding process using the aluminum wire have to be performed separately.

Further, in the prior-art power semiconductor device, there are some portions on the first main surface of the power semiconductor chip where no conductive film having the above layered structure is formed (the aluminum wire is bonded in a manner of wire bonding). Therefore, the prior-art power semiconductor device can not sufficiently relieve the warp of the power semiconductor chip.

SUMMARY OF THE INVENTION

It is an object of the present invention to ensure simplification of manufacturing process and provide a power semiconductor device capable of suppressing warp of a power semiconductor chip.

According to the present invention, a semiconductor device includes a semiconductor chip, first and second metal layers, a first conductive layer, a second conductive layer and a third conductive layer. The first and second metal layers are formed on a first main surface of the semiconductor chip. The first conductive layer is layered on a second main surface of the semiconductor chip and consists of a plurality of conductive films. The second conductive layer has a layered structure consisting of a plurality of conductive films formed in the same order as in the first conductive layer as viewed from the semiconductor chip and is layered on the first metal layer. The third conductive layer has a layered structure consisting of a plurality of conductive films formed in the same order as in the first conductive layer as viewed from the semiconductor chip and is layered on the second metal layer. The plurality of conductive films include a nickel film and a low contact resistance conductive film. The low contact resistance conductive film has contact resistance with the semiconductor chip which is lower than that of the nickel film. The low contact resistance conductive film and the nickel film are formed in this order from the semiconductor chip.

The present invention makes it possible to bond an electrode plate to each of the conductive layers with solder. Therefore, all the electrode plates can be simultaneously bonded in a manner of direct lead bonding in the same process. This allows simplification of manufacturing process. Further, since connection of all the electrode plates directly to the device with no wire such as aluminum wire becomes possible, it is possible to ensure reduction in power consumption during operation of the semiconductor device. Furthermore, since the electrode plates having high strength because of their plate-like shape are directly formed, not using aluminum wire of low strength, electrical failures such as a problematic break in the aluminum wire can be solved. Since the third conductive layer has the same layered structure as the first conductive layer has as viewed from the power semiconductor chip, the semiconductor device of the present invention can suppress warp of the semiconductor chip more effectively than conventional one by formation of the third conductive layer.

These and other objects, features, aspects and advantages of the present invention will become more apparent from the following detailed description of the present invention when taken in conjunction with the accompanying drawings.

DESCRIPTION OF THE PREFERRED EMBODIMENTS

Now, specific discussion will be made on the present invention, referring to figures showing preferred embodiments thereof.

The First Preferred Embodiment

Figure 1:
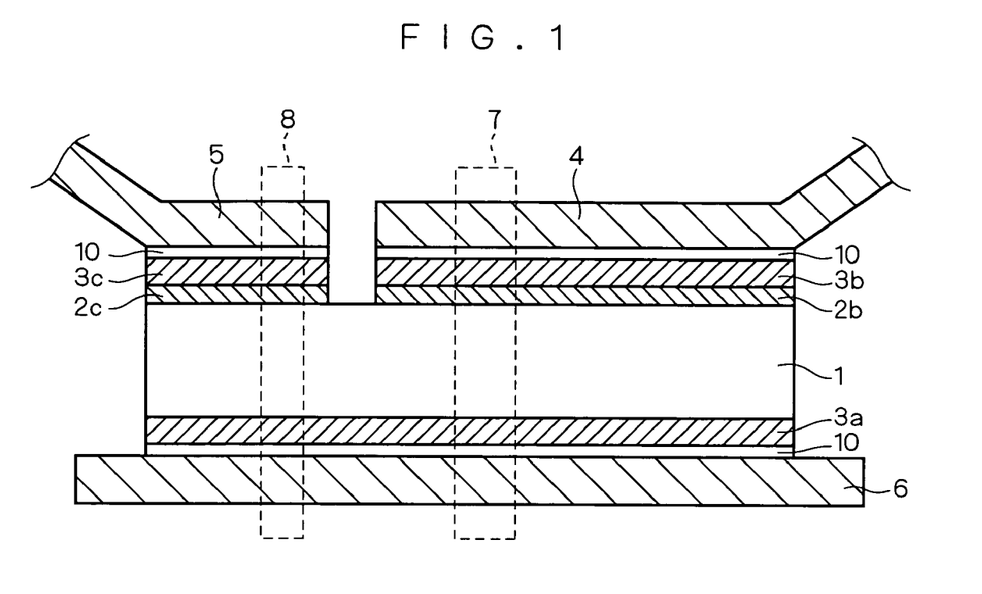
FIG. 1 is a cross section schematically showing a structure of a power semiconductor device in accordance with the present invention.

FIG. 1 is a cross section showing a structure of a power semiconductor device in accordance with the first preferred embodiment. In FIG. 1, for convenience of illustration, a package, terminals in the package, an insulating substrate below a first main electrode plate (drain electrode plate) and the like are not shown.

As shown in FIG. 1, on a second main surface of a power semiconductor chip 1 (on a lower surface of the power semiconductor chip 1 in FIG. 1), a first conductive layer 3a is formed. The first conductive layer 3a is bonded onto a first main electrode plate (drain electrode plate) 6 with solder 10 interposed therebetween in a manner of direct lead bonding.

The first conductive layer 3a has a layered structure consisting of a plurality of conductive films. The first main electrode plate 6 is formed of, e.g., copper (Cu) or the like.

Though not shown, a predetermined pattern is formed on a first main surface of the power semiconductor chip 1 (on an upper surface of the power semiconductor chip 1 in FIG. 1). As the power semiconductor chip 1, for example, an IGBT (Insulated Gate Bipolar Transistor), a diode or the like may be used. The power semiconductor chip 1 has been so polished with respect to its second main surface as to have a predetermined thickness (e.g., about 200 μm).

Further, as shown in FIG. 1, two metal layers 2b and 2c are formed on the first main surface of the power semiconductor chip 1. The metal layers 2b and 2c are provided in order to protect the pattern formed on the first main surface of the power semiconductor chip 1 from external forces, in other word, to serve as a cushion member for protecting the pattern.

The metal layers 2b and 2c are electrically isolated from each other and each a metal layer of aluminum-silicon or the like.

Furthermore, as shown in FIG. 1, a second conductive layer 3b is formed on one of the metal layers 2b. On the other hand, a third conductive layer 3c is formed on the other metal layer 2c. The second conductive layer 3b and the third conductive layer 3c each have a layered structure consisting of a plurality of conductive films, where the conductive films are layered in the same order as in the layered structure of the first conductive layer 3a as viewed from the power semiconductor chip 1.

Not only the order of formation of the conductive films, but also the thickness of the corresponding conductive films may be the same. In other words, respective thicknesses of those conductive films constituting the second conductive layer 3b and the third conductive layer 3c may be equal to the thicknesses of the corresponding conductive films in the first conductive layer 3a.

As shown in FIG. 1, a second main electrode plate (source electrode plate) 4 is provided on the second conductive layer 3b, and a control electrode plate (gate electrode plate) 5 is provided on the third conductive layer 3c.

The second main electrode plate 4 is bonded to the second conductive layer 3b with the solder 10 and the control electrode plate 5 is bonded to the third conductive layer 3c with the solder 10 both in the manner of direct lead bonding. The second main electrode plate 4 and the control electrode plate 5 are each formed of copper (Cu) or the like.

Figure 2:
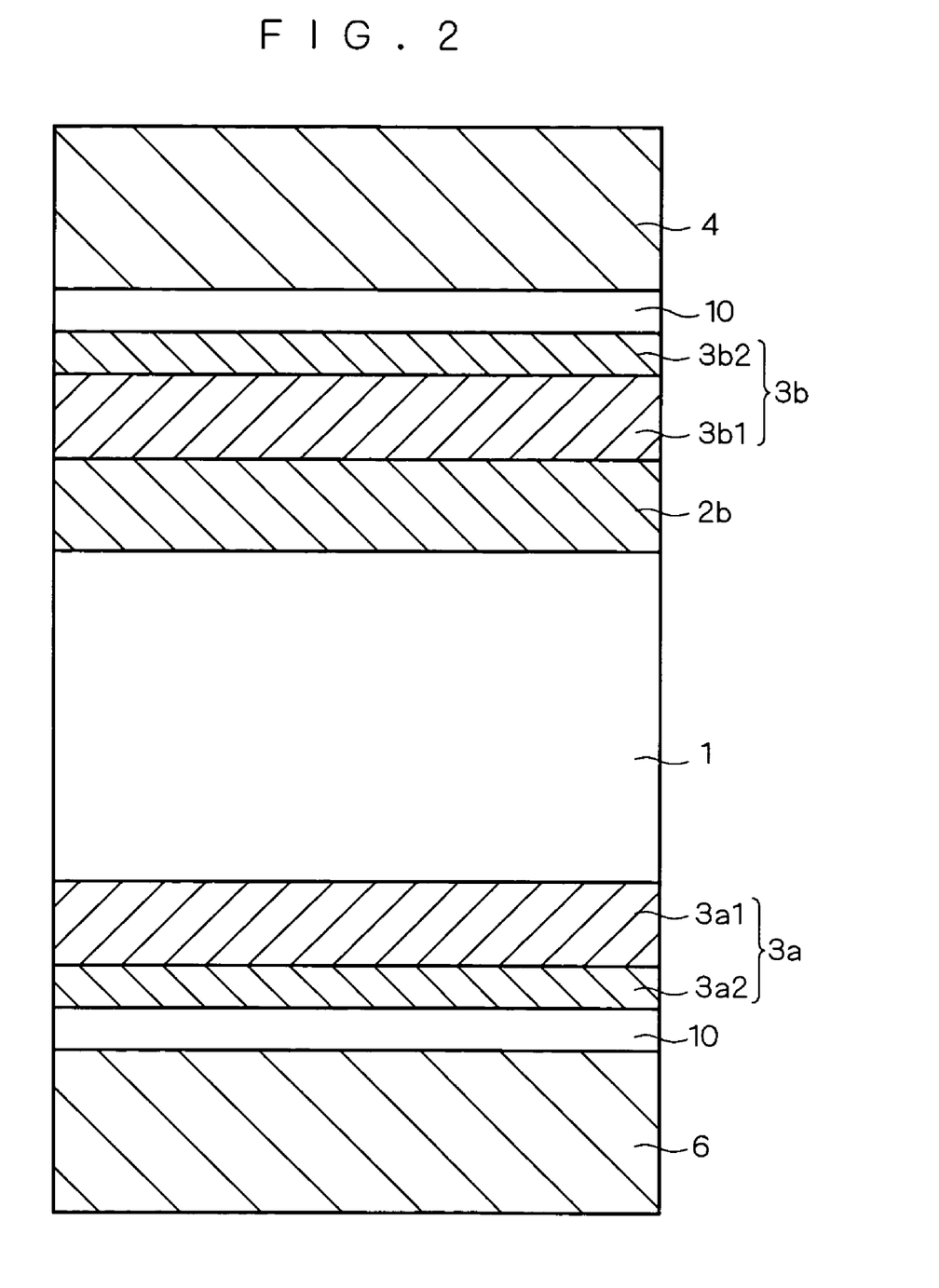
FIGS. 2 and 3 are cross sections showing part of a power semiconductor device in accordance with a first preferred embodiment.

Next, referring to FIG. 2, specific structures of the conductive layers 3a and 3b will be described. FIG. 2 is an enlarged cross section showing a region surrounded by the broken line 7 of FIG. 1.

As shown in FIG. 2, the first conductive layer 3a and the second conductive layer 3b each have a layered structure consisting of a plurality of conductive films. The conductive films are formed by, e.g., sputtering, vapor deposition, or plating.

The first conductive layer 3a has a layered structure in which a low contact resistance conductive film 3a1 and a nickel film 3a2 are layered in this order on the second main surface.

The low contact resistance conductive film 3a1 is a conductive film having low contact resistance with the power semiconductor chip 1. The contact resistance between the low contact resistance conductive film 3a1 and the power semiconductor chip 1 is lower than that between the nickel film 3a2 and the power semiconductor chip 1. The low contact resistance conductive film 3a1 is formed on the second main surface of the power semiconductor chip 1, being in contact therewith. The nickel film 3a2 is a conductive film provided to ensure bonding of the first main electrode plate 6 to the power semiconductor chip 1 with the solder 10.

Further, as shown in FIG. 2, in order to relieve a warp of the power semiconductor chip 1, the second conductive layer 3b is formed on the metal layer 2b, which has a layered structure in which the conductive films are layered in the same order as in the first conductive layer 3a as viewed from the power semiconductor chip 1 (where the corresponding conductive films in the first and second conductive layers 3a and 3b may have the same thickness as discussed above).

Specifically, the second conductive layer 3b has a layered structure in which a low contact resistance conductive film 3b1 and a nickel film 3b2 are layered in this order from the power semiconductor chip 1. The nickel film 3b2 is an outermost film from the power semiconductor chip 1, which is provided to ensure bonding of the second main electrode plate 4 to the power semiconductor chip 1 with the solder 10.

Though gold films having a thickness of about 200 nm are provided between the nickel film 3a2 and the solder 10 and between the nickel film 3b2 and the solder 10 in order to prevent oxidation of the nickel films 3a2 and 3b2, the gold films are dissolved and their entities are vanished in bonding of the main electrode plates 4 and 6.

Figure 3:
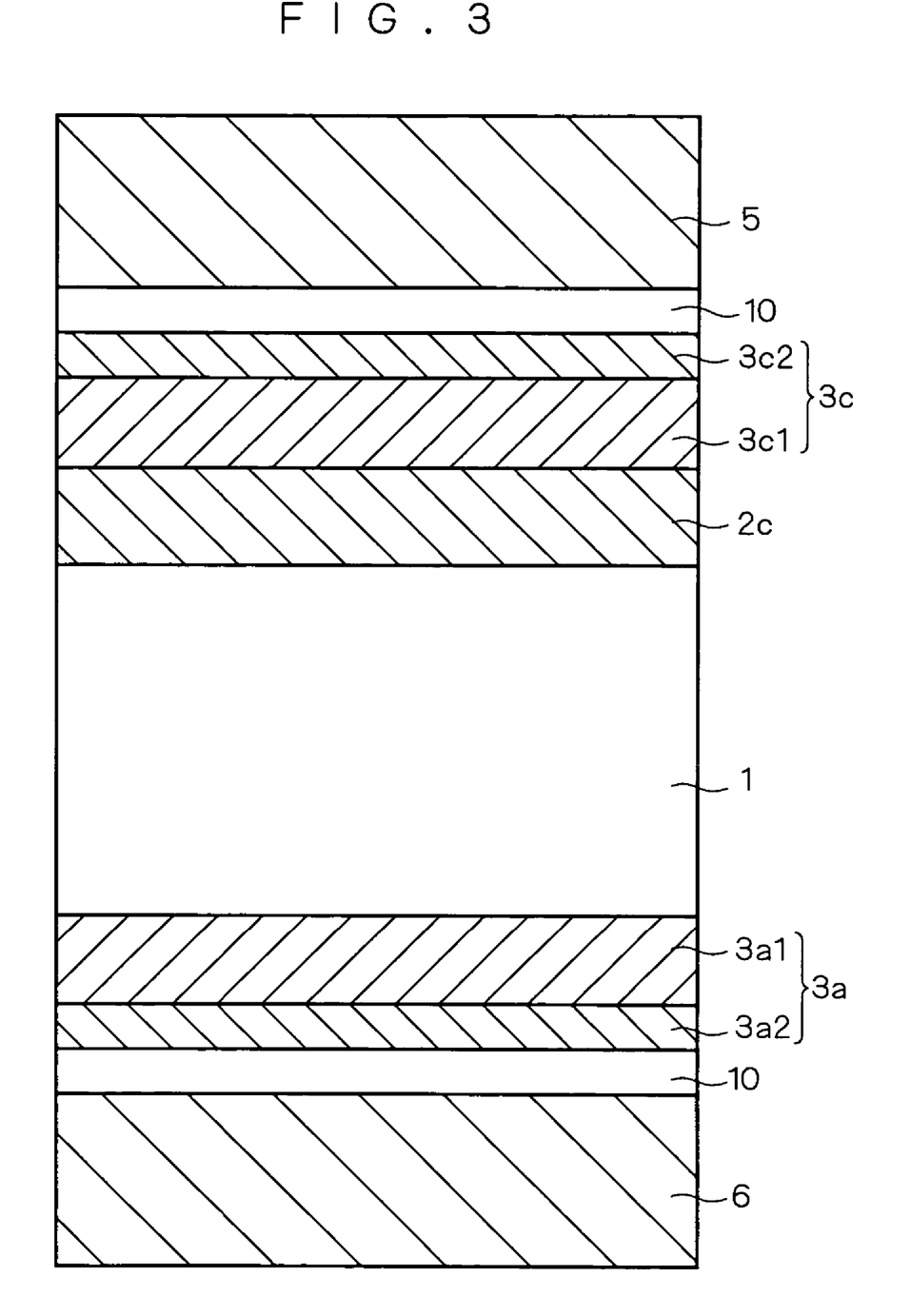

Next, referring to FIG. 3, a specific structure of the conductive layer 3c will be described. FIG. 3 is an enlarged cross section showing a region surrounded by the broken line 8 of FIG. 1.

As shown in FIG. 3, the third conductive layer 3c has a layered structure consisting of a plurality of conductive films. The conductive films are formed by, e.g., sputtering, vapor deposition, or plating.

Since the structure of the first conductive layer 3a is the same as shown in FIG. 2, specific description thereof will be omitted.

As shown in FIG. 3, in order to further relieve the warp of the power semiconductor chip 1, the third conductive layer 3c is formed on the metal layer 2c, which has a layered structure in which the conductive films are layered in the same order as in the first conductive layer 3a as viewed from the power semiconductor chip 1 (where the corresponding conductive films in the first and third conductive layers 3a and 3c may have the same thickness as discussed above).

Specifically, the third conductive layer 3c has a layered structure in which a low contact resistance conductive film 3c1 and a nickel film 3c2 are layered in this order from the power semiconductor chip 1. The nickel film 3c2 is an outermost film from the power semiconductor chip 1, which is provided to ensure bonding of the control electrode plate 5 to the power semiconductor chip 1 with the solder 10.

Though a gold film having a thickness of about 200 nm is provided between the nickel film 3c2 and the solder 10 in order to prevent oxidation of the nickel film 3c2, the gold film is dissolved and its entity is vanished in bonding of the control electrode plate 5.

As can be seen from FIGS. 1 and 3, in the power semiconductor device of the first preferred embodiment, the third conductive layer 3c having the nickel film 3c2 which is an outermost film from the power semiconductor chip 1 is formed on the side of a first main surface of the power semiconductor chip 1. This makes it possible to bond the control electrode plate 5 to the power semiconductor chip 1 with the solder 10 in a manner of direct lead bonding.

It thereby becomes possible to bond the second main electrode plate 4 and the control electrode plate 5 to the power semiconductor chip 1 with the solder 10 in the same process. In other words, this allows simultaneous direct lead bonding of the second main electrode plate 4 and the control electrode plate 5. Therefore, simplification of manufacturing process can be achieved.

Since the control electrode plate 5 is connected directly to the device with no wire such as aluminum wire interposed therebetween, it is possible to ensure reduction in power consumption during operation of the power semiconductor device.

Further, since the control electrode plate 5 having high strength because of its plate-like shape is directly provided, not using the wire such as aluminum wire having low strength, electrical failures such as a problematic break in the aluminum wire can be solved.

Furthermore, since the third conductive layer 3c has a layered structure in which the conductive films are layered in the same order as in the first conductive layer 3a as viewed from the power semiconductor chip 1 (where the corresponding conductive films in the first and third conductive layers 3a and 3c may have the same thickness as discussed above), it is possible to further suppress the warp of the power semiconductor chip 1 by formation of the third conductive layer 3c.

Specifically, when a heat treatment is performed on the power semiconductor device, a transverse stress is exerted on the second main surface side of the power semiconductor chip 1 due to presence of the first conductive layer 3a and a transverse stress is exerted on the first main surface side of the power semiconductor chip 1 due to presence of the second and third conductive layers 3b and 3c.

Since the third conductive layer 3c has the above layered structure, however, it is possible to reduce the difference between these transverse stresses by formation of the third conductive layer 3c.

Therefore, the power semiconductor device of the first preferred embodiment can further suppress such a warp as to make the first main surface side of the power semiconductor chip 1 convex, by formation of the third conductive layer 3c, as compared with the prior-art power semiconductor devices not having the third conductive layer 3c.

Though the above discussion has been made on the case where the metal layers 2b and 2c each of aluminum-silicon or the like are each a single layer, the metal layers 2b and 2c may be each multilayered to have a larger thickness. Since the metal layers 2b and 2c serve as reinforcements against the warp of the power semiconductor chip 1, it becomes possible to further relieve the warp of power semiconductor chip 1 by thickening the metal layers 2b and 2c.

The Second Preferred Embodiment

Figure 4:
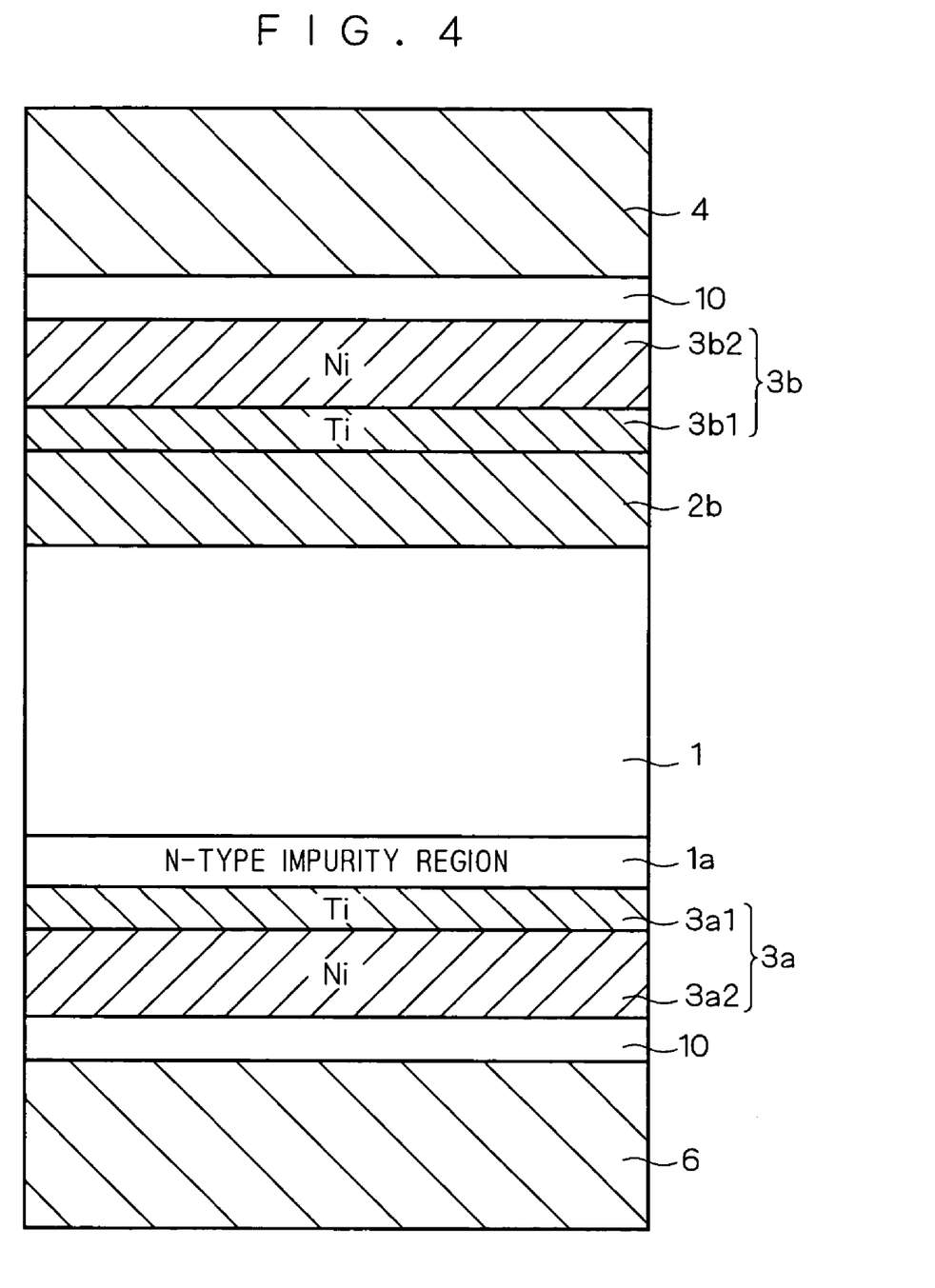
FIGS. 4 and 5 are cross sections showing part of a power semiconductor device in accordance with a second preferred embodiment.
Figure 5:
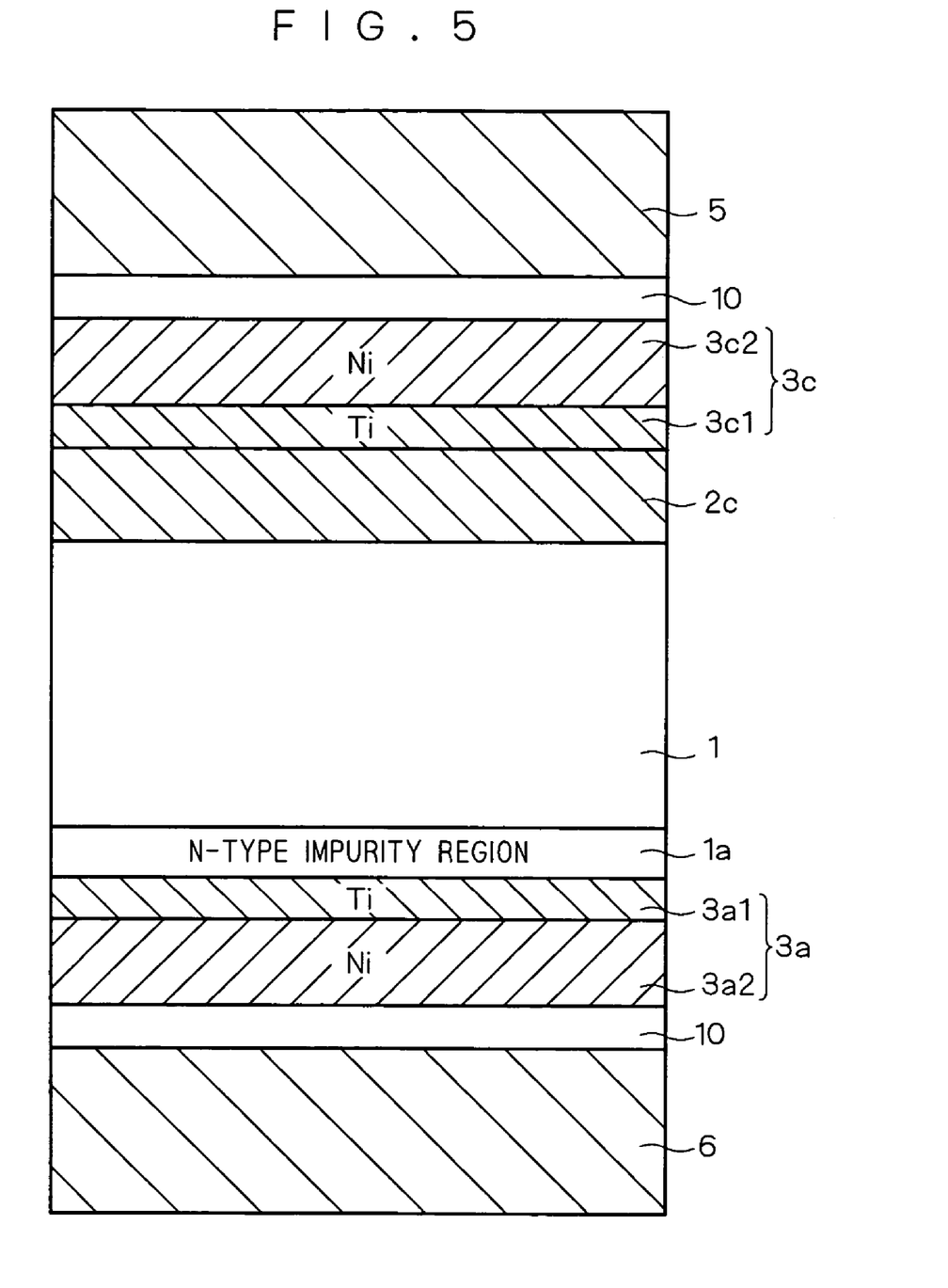

A power semiconductor device of the second preferred embodiment is shown in FIGS. 4 and 5. FIG. 4 is a cross section showing the power semiconductor device of the second preferred embodiment, enlarging a region surrounded by the broken line 7 of FIG. 1. FIG. 5 is a cross section showing the power semiconductor device of the second preferred embodiment, enlarging a region surrounded by the broken line 8 of FIG. 1.

First, the structure of FIG. 4 will be described.

As shown in FIG. 4, in the second main surface of the power semiconductor chip 1, an N-type impurity region 1a is formed. The impurity concentration of the N-type impurity region is $1 \times 10^{19}$ or more.

The first conductive layer 3a formed on the second main surface side of the power semiconductor chip 1 consists of a titanium film 3a1 and the nickel film 3a2, as shown in FIG. 4. In other words, the titanium film 3a1 is adopted as the low contact resistance conductive film.

The titanium film 3a1 is formed on the second main surface of the power semiconductor chip 1. The nickel film 3a2 is formed on the titanium film 3a1. The titanium film 3a1 has a thickness of about 30 nm. The nickel film 3a2 has a thickness of about 200 nm.

Though a gold film having a thickness of about 400 nm is provided between the nickel film 3a2 and the solder 10 in order to prevent oxidation of the nickel film 3a2, the gold film is dissolved and its entity is vanished in bonding of the first main electrode plate 6.

Further, as shown in FIG. 4, the metal layer 2b is formed on the first main surface of the power semiconductor chip 1. On the metal layer 2b, the second conductive layer 3b is formed, which has a layered structure in which the conductive films are layered in the same order as in the first conductive layer 3a as viewed from the power semiconductor chip 1 (where the corresponding conductive films in the first and second conductive layers 3a and 3b may have the same thickness, like in the first preferred embodiment).

In other words, the second conductive layer 3b is constituted of a titanium film 3b1 formed on the metal layer 2b and the nickel film 3b2 formed on the titanium film 3b1. The conductive film 3b1 has a thickness equal to that of the conductive film 3a1 in the first conductive layer 3a and the conductive film 3b2 has a thickness equal to that of the conductive film 3a2 in the first conductive layer 3a.

Though a gold film having a thickness of about 400 nm is provided between the nickel film 3b2 and the solder 10 in order to prevent oxidation of the nickel film 3b2, the gold film is dissolved and its entity is vanished in bonding of the second main electrode plate 4.

Next, the structure of FIG. 5 will be described.

As shown in FIG. 5, in the second main surface of the power semiconductor chip 1, the N-type impurity region 1a shown in FIG. 4 is formed.

The structure of the first conductive layer 3a formed on the second main surface side of the power semiconductor chip 1 is the same as shown in FIG. 4.

Further, as shown in FIG. 5, the metal layer 2c is formed on the first main surface of the power semiconductor chip 1. On the metal layer 2c, the third conductive layer 3c is formed, which has a layered structure in which the conductive films are layered in the same order as in the first conductive layer 3a as viewed from the power semiconductor chip 1 (where the corresponding conductive films in the first and third conductive layers 3a and 3c may have the same thickness as discussed above).

In other words, the third conductive layer 3c is constituted of a titanium film 3c1 formed on the metal layer 2c and the nickel film 3c2 formed on the titanium film 3c1. The conductive film 3c1 has a thickness equal to that of the conductive film 3a1 in the first conductive layer 3a and the conductive film 3c2 has a thickness equal to that of the conductive film 3a2 in the first conductive layer 3a.

Though a gold film having a thickness of about 400 nm is provided between the nickel film 3c2 and the solder 10 in order to prevent oxidation of the nickel film 3c2, the gold film is dissolved and its entity is vanished in bonding of the control electrode plate 5.

In the power semiconductor device of the second preferred embodiment, as the low contact resistance conductive film in contact with the N-type impurity region 1a formed in the main surface of the power semiconductor chip 1, the titanium film 3a1 which has low contact resistance with the N-type impurity region 1a is adopted, and it is thereby possible to reduce the contact resistance between the power semiconductor chip 1 and the titanium film 3a1 to a lower value.

It goes without saying that the second preferred embodiment also has the effect of relieving the warp of the power semiconductor chip 1, like the power semiconductor device of the first preferred embodiment.

The Third Preferred Embodiment

Figure 6:
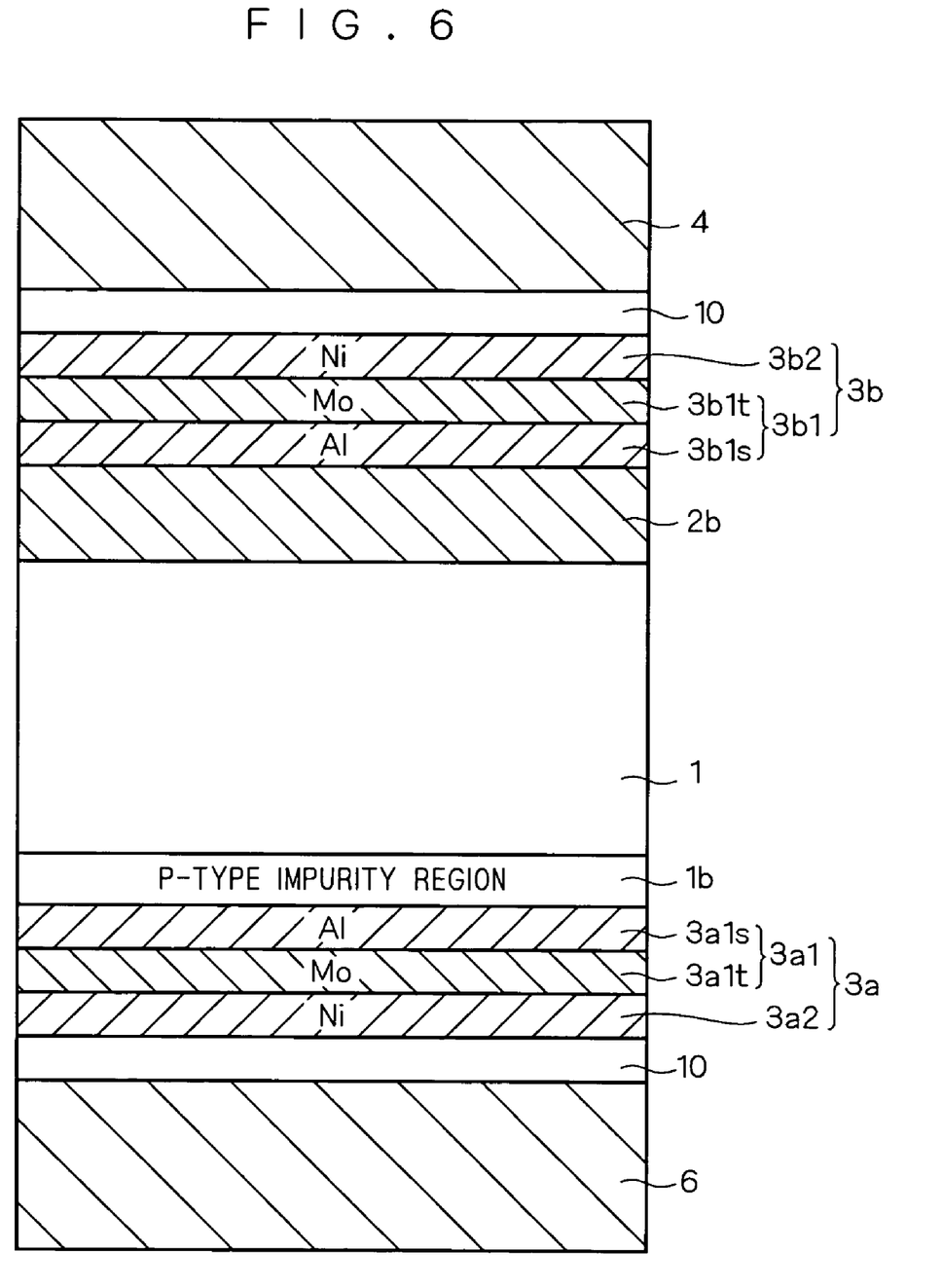
FIGS. 6 and 7 are cross sections showing part of a power semiconductor device in accordance with a third preferred embodiment.
Figure 7:
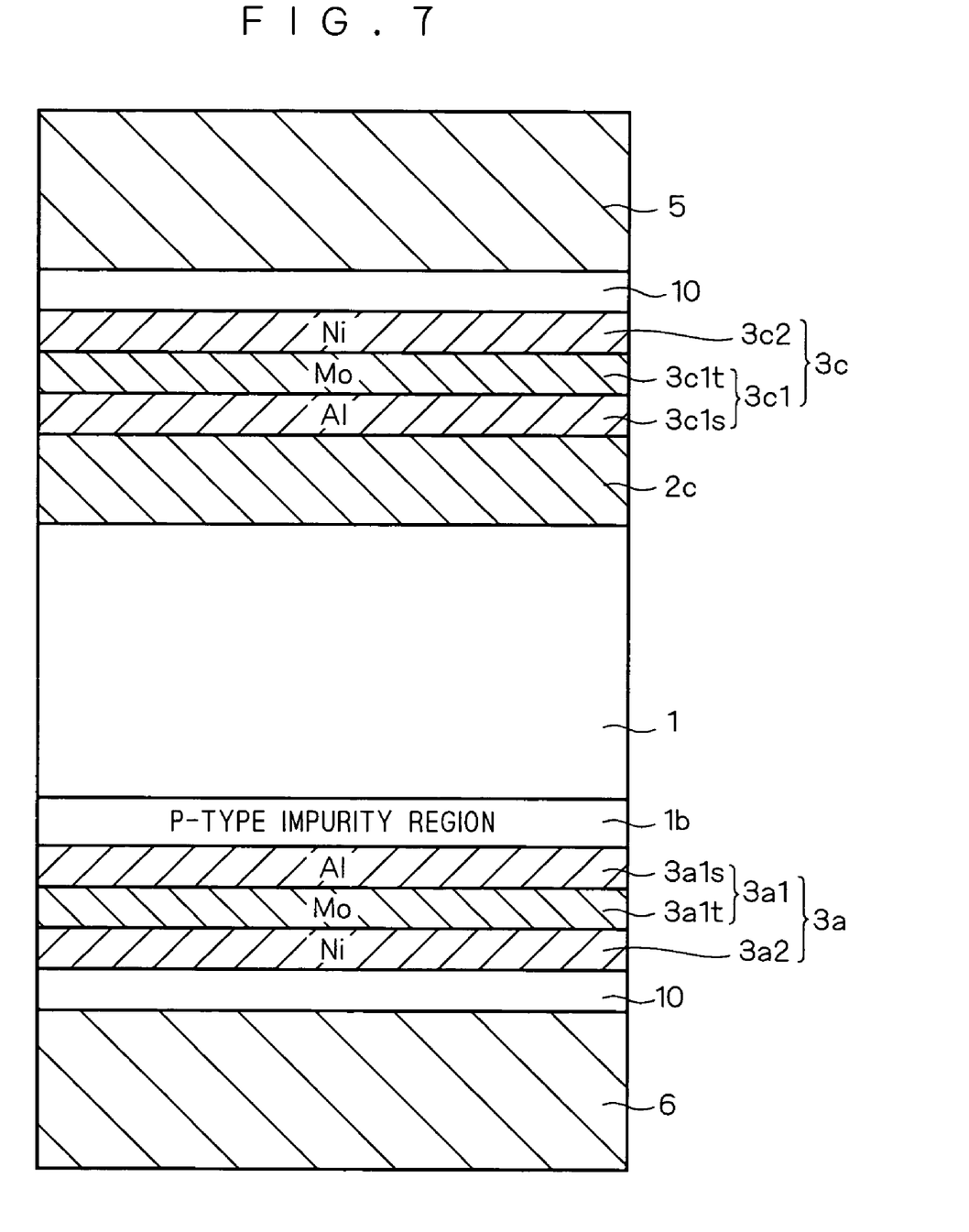

A power semiconductor device of the third preferred embodiment is shown in FIGS. 6 and 7. FIG. 6 is a cross section showing the power semiconductor device of the third preferred embodiment, enlarging a region surrounded by the broken line 7 of FIG. 1. FIG. 7 is a cross section showing the power semiconductor device of the third preferred embodiment, enlarging a region surrounded by the broken line 8 of FIG. 1.

First, the structure of FIG. 6 will be described.

As shown in FIG. 6, in the second main surface of the power semiconductor chip 1, a P-type impurity region 1b is formed. The impurity concentration of the P-type impurity region is $1 \times 10^{19}$ or more.

The first conductive layer 3a formed on the second main surface side of the power semiconductor chip 1 consists of an aluminum film 3a1s, a molybdenum film 3a1t and the nickel film 3a2, as shown in FIG. 6. In other words, the aluminum film 3a1s and the molybdenum film 3a1t are adopted as the low contact resistance conductive film 3a1.

The aluminum film 3a1s is formed on the second main surface of the power semiconductor chip 1. The molybdenum film 3a1t is formed on the aluminum film 3a1s. The nickel film 3a2 is formed on the molybdenum film 3a1t. The aluminum film 3a1s has a thickness of about 800 nm. The molybdenum film 3a1t has a thickness of about 180 nm. The nickel film 3a2 has a thickness of about 300 nm.

Though a gold film having a thickness of about 200 nm is provided between the nickel film 3a2 and the solder 10 in order to prevent oxidation of the nickel film 3a2, the gold film is dissolved and its entity is vanished in bonding of the first main electrode plate 6.

Further, as shown in FIG. 6, the metal layer 2b is formed on the first main surface of the power semiconductor chip 1. On the metal layer 2b, the second conductive layer 3b is formed, which has a layered structure in which the conductive films are layered in the same order as in the first conductive layer 3a as viewed from the power semiconductor chip 1 (where the corresponding conductive films in the first and second conductive layers 3a and 3b may have the same thickness, like in the first preferred embodiment).

In other words, the second conductive layer 3b is constituted of an aluminum film 3b1s formed on the metal layer 2b, a molybdenum film 3b1t formed on the aluminum film 3b1s and the nickel film 3b2 formed on the molybdenum film 3b1t. The conductive film 3b1s has a thickness equal to that of the conductive film 3a1s in the first conductive layer 3a, the conductive film 3b1t has a thickness equal to that of the conductive film 3a1t in the first conductive layer 3a and the conductive film 3b2 has a thickness equal to that of the conductive film 3a2 in the first conductive layer 3a.

Though a gold film having a thickness of about 200 nm is provided between the nickel film 3b2 and the solder 10 in order to prevent oxidation of the nickel film 3b2, the gold film is dissolved and its entity is vanished in bonding of the second main electrode plate 4.

Next, the structure of FIG. 7 will be described.

As shown in FIG. 7, in the second main surface of the power semiconductor chip 1, the P-type impurity region 1b shown in FIG. 6 is formed.

The structure of the first conductive layer 3a formed on the second main surface side of the power semiconductor chip 1 is the same as shown in FIG. 6.

Further, as shown in FIG. 7, the metal layer 2c is formed on the first main surface of the power semiconductor chip 1. On the metal layer 2c, the third conductive layer 3c is formed, which has a layered structure in which the conductive films are layered in the same order as in the first conductive layer 3a as viewed from the power semiconductor chip 1 (where the corresponding conductive films in the first and third conductive layers 3a and 3c may have the same thickness as discussed above).

In other words, the third conductive layer 3c is constituted of an aluminum film 3c1s formed on the metal layer 2c, a molybdenum film 3c1t formed on the aluminum film 3c1s and the nickel film 3c2 formed on the molybdenum film 3c1t. The conductive film 3c1s has a thickness equal to that of the conductive film 3a1s in the first conductive layer 3a, the conductive film 3c1t has a thickness equal to that of the conductive film 3a1t in the first conductive layer 3a and the conductive film 3c2 has a thickness equal to that of the conductive film 3a2 in the first conductive layer 3a.

Though a gold film having a thickness of about 200 nm is provided between the nickel film 3c2 and the solder 10 in order to prevent oxidation of the nickel film 3c2, the gold film is dissolved and its entity is vanished in bonding of the control electrode plate 5.

In the power semiconductor device of the third preferred embodiment, as the low contact resistance conductive film in contact with the P-type impurity region 1b formed in the main surface of the power semiconductor chip 1, a layered film consisting of the aluminum film and the molybdenum film which has low contact resistance with the P-type impurity region 1b is adopted, and it is thereby possible to reduce the contact resistance between the power semiconductor chip 1 and the layered film to a lower value.

It goes without saying that the third preferred embodiment also has the effect of relieving the warp of the power semiconductor chip 1, like the power semiconductor device of the first preferred embodiment.

The Fourth Preferred Embodiment

In the power semiconductor device of the fourth preferred embodiment, the metal layers 2b and 2c formed on the first main surface of the power semiconductor chip 1 include the same metal elements as the low contact resistance conductive films 3b1 and 3c1 have in their portions with which the metal layers 2b and 2c are in contact, respectively.

In the power semiconductor device of the third preferred embodiment, for example, the metal element in one of the conductive films constituting each of the low contact resistance conductive films 3b1 and 3c1, which is in contact with the metal layers 2b or 2c, is aluminum (see FIGS. 6 and 7). Therefore, the metal layers 2b and 2c include this aluminum.

With such a structure as above, the respective potential barriers between the metal layers 2b and 2c and the low contact resistance conductive films 3a1, 3b1 and 3c1 can be lowered. Therefore, the respective contact resistances between the metal layers 2b and 2c and the low contact resistance conductive films 3b1 and 3c1 can be further reduced.

In the above-discussed preferred embodiments, as the power semiconductor chip 1, an IGBT, a MOSFET (Metal Oxide Semiconductor Field Effect Transistor), a diode (if a diode is used, no control electrode is provided and therefore the metal layer to be formed on the control electrode is not provided), a thyristor or the like may be adopted.

If an IGBT is adopted as the power semiconductor chip 1, especially, the following effect can be achieved.

Specifically, in the conventional IGBT, when wires are connected to the control electrode in a manner of wire bonding, this causes heating in the connection part, resulting in a disadvantageous increase of resistance in the connection part.

In the power semiconductor devices of the present invention, however, since the control electrode plate is directly bonded to the IGBT in a manner of direct lead bonding with no wire therebetween, the problem of increasing the resistance in the connection part between the IGBT and the wires due to heating can be solved.

Though the above discussion of the preferred embodiments has been made on the case where the power semiconductor chip 1 is used as a single unit, the above preferred embodiments can be applied to a case where an HVIC (High Voltage Integrated Circuit) consisting of a plurality of power semiconductor chips 1 is used instead of the single power semiconductor chip 1.

Application of the above-discussed preferred embodiments is not limited to the power semiconductor chip 1 but can be made to semiconductor chips other than power semiconductor chips. Further, the above-discussed preferred embodiments can be applied to an LSI (Large Scale Integrated Circuit) consisting of a plurality of power semiconductor chips.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
   a semiconductor chip;
   first and second metal layers formed on a first main surface of said semiconductor chip;
   a first conductive layer layered on a second main surface of said semiconductor chip, consisting of a plurality of conductive films;
   a second conductive layer layered on said first metal layer, having a layered structure consisting of a plurality of conductive films formed in the same order as in said first conductive layer as viewed from said semiconductor chip; and
   a third conductive layer layered on said second metal layer, having a layered structure consisting of a plurality of conductive films formed in the same order as in said first conductive layer as viewed from said semiconductor chip,
   wherein said plurality of conductive films comprise
   a nickel film; and
   a low contact resistance conductive film having contact resistance with said semiconductor chip which is lower than that of said nickel film,
   and wherein said low contact resistance conductive film and said nickel film are formed in this order from said semiconductor chip.

2. The semiconductor device according to claim 1, further comprising
   first to third electrode plates provided on said first to third conductive layers with solders interposed therebetween, respectively.

3. The semiconductor device according to claim 1, wherein
   said semiconductor chip comprises an N-type impurity region formed in said second main surface, and
   said low contact resistance conductive film is a titanium film.

4. The semiconductor device according to claim 2, wherein
   said semiconductor chip comprises an N-type impurity region formed in said second main surface, and
   said low contact resistance conductive film is a titanium film.

5. The semiconductor device according to claim 1, wherein said semiconductor chip comprises a P-type impurity region formed in said second main surface, and said low contact resistance conductive film consists of an aluminum film and a molybdenum film which are layered in this order from said semiconductor chip.

6. The semiconductor device according to claim 2, wherein said semiconductor chip comprises a P-type impurity region formed in said second main surface, and said low contact resistance conductive film consists of an aluminum film and a molybdenum film which are layered in this order from said semiconductor chip.

7. The semiconductor device according to claim 1, wherein said first and second metal layers each include the same metal element as portions of said low contact resistance conductive films being contact with said first and second metal layers, respectively.

8. The semiconductor device according to claim 2, wherein said first and second metal layers each include the same metal element as portions of said low contact resistance conductive films being contact with said first and second metal layers, respectively.

9. The semiconductor device according to claim 1, wherein said semiconductor chip is an insulated gate transistor.

10. The semiconductor device according to claim 2, wherein said semiconductor chip is an insulated gate transistor.

11. The semiconductor device according to claim 3, wherein said semiconductor chip is an insulated gate transistor.

12. The semiconductor device according to claim 4, wherein said semiconductor chip is an insulated gate transistor.

13. The semiconductor device according to claim 5, wherein said semiconductor chip is an insulated gate transistor.

14. The semiconductor device according to claim 6, wherein said semiconductor chip is an insulated gate transistor.

15. The semiconductor device according to claim 7, wherein said semiconductor chip is an insulated gate transistor.

16. The semiconductor device according to claim 8, wherein said semiconductor chip is an insulated gate transistor.

* * * * *